(12) United States Patent
Hashimoto et al.

(10) Patent No.: US 9,780,134 B2
(45) Date of Patent: Oct. 3, 2017

(54) SEMICONDUCTOR DEVICE AND METHOD OF FORMING THE SAME

(71) Applicant: TAIWAN SEMICONDUCTOR MANUFACTURING COMPANY LTD., Hsinchu (TW)

(72) Inventors: Kazuaki Hashimoto, Hsinchu County (TW); Jen-Cheng Liu, Hsinchu County (TW); Wei-Chieh Chiang, Changhua County (TW); Pao-Tung Chen, Tainan Hsien (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/279,371

(22) Filed: May 16, 2014

(65) Prior Publication Data

US 2015/0334324 A1    Nov. 19, 2015

(51) Int. Cl.

| | |
|---|---|
| *H01L 27/148* | (2006.01) |
| *H01L 27/146* | (2006.01) |
| *H04N 5/374* | (2011.01) |
| *H01L 31/0352* | (2006.01) |
| *H04N 5/369* | (2011.01) |

(52) U.S. Cl.
CPC .. *H01L 27/14629* (2013.01); *H01L 27/14607* (2013.01); *H01L 27/14621* (2013.01); *H01L 27/14627* (2013.01); *H01L 27/14685* (2013.01); *H01L 27/14692* (2013.01); *H01L 31/035281* (2013.01); *H04N 5/3696* (2013.01); *H04N 5/374* (2013.01)

(58) Field of Classification Search
CPC ......... H01L 27/14629; H01L 27/14621; H01L 27/14627; H01L 27/14607; H01L 27/14685; H01L 31/035281; H01L 27/14692; H04N 5/374; H04N 5/3696
See application file for complete search history.

(56) References Cited

U.S. PATENT DOCUMENTS

| | | | |
|---|---|---|---|
| 8,878,116 B2 * | 11/2014 | Itonaga | 250/208.1 |
| 2005/0218488 A1 * | 10/2005 | Matsuo | B81C 1/00095 257/678 |
| 2007/0096235 A1 * | 5/2007 | Boettiger et al. | 257/434 |
| 2009/0194668 A1 * | 8/2009 | Kong | G02B 7/08 250/201.2 |
| 2011/0096419 A1 * | 4/2011 | Matsuo | G02B 7/08 359/820 |

(Continued)

*Primary Examiner* — Su C Kim
(74) *Attorney, Agent, or Firm* — WPAT, P.C., Intellectual Property Attorneys; Anthony King

(57) ABSTRACT

In some embodiments in accordance with the present disclosure, an image sensor is provided. The image sensor includes a substrate having a body. The body includes a first surface and a second surface opposite to the first surface. A through via is configured to extend from the first surface to the second surface. An intermediate layer is disposed over the body and configured to cover the through via. An image sensing device is disposed over the intermediate layer. In addition, a lens structure is disposed over the substrate, the intermediate layer and the image sensing device. In certain embodiments, the image sensing device is curved. In some embodiments, the image sensing device includes a semiconductor chip having a CMOS image sensing array.

20 Claims, 10 Drawing Sheets

(56) References Cited

U.S. PATENT DOCUMENTS

| | | | |
|---|---|---|---|
| 2012/0200926 A1* | 8/2012 | Matsushita | G01J 3/26 359/578 |
| 2012/0217606 A1* | 8/2012 | Itonaga | H01L 31/0203 257/443 |
| 2014/0211315 A1* | 7/2014 | Matsushita | G01J 3/26 359/578 |
| 2014/0218586 A1* | 8/2014 | Sano | G01J 3/26 348/335 |

* cited by examiner

SEMICONDUCTOR DEVICE AND METHOD OF FORMING THE SAME

BACKGROUND

An image sensor provides a grid of pixels which may contain photosensitive diodes or photodiodes, reset transistors, source follower transistors, pinned layer photodiodes, and/or transfer transistors for recording intensity or brightness of light. The pixel responds to the light by accumulating photo-charges—the more light, the more the photo-charges. The charges can then be used by another circuit so that a color and brightness can be used for a suitable application, such as a digital camera. Common types of pixel grids include a charge-coupled device (CCD), a complimentary metal oxide semiconductor (CMOS) image sensor (CIS), an active-pixel sensor (APS), and a passive-pixel sensor.

When integrated with semiconductor devices to be applied to modern consumer electronic devices, size of image sensors is desired to be reduced to ensure mobility of the devices. For example, CIS is widely used in applications such as digital camera or mobile phone camera due to its miniaturized size. These devices utilize an array of pixels located in a substrate, including photodiodes and transistors that can absorb radiation projected toward the substrate, and convert the sensed radiation into electrical signals. However, the demand for even smaller image sensors has posed challenges such as heat control or durability. Measures to improve semiconductor image sensors are continuously being sought.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
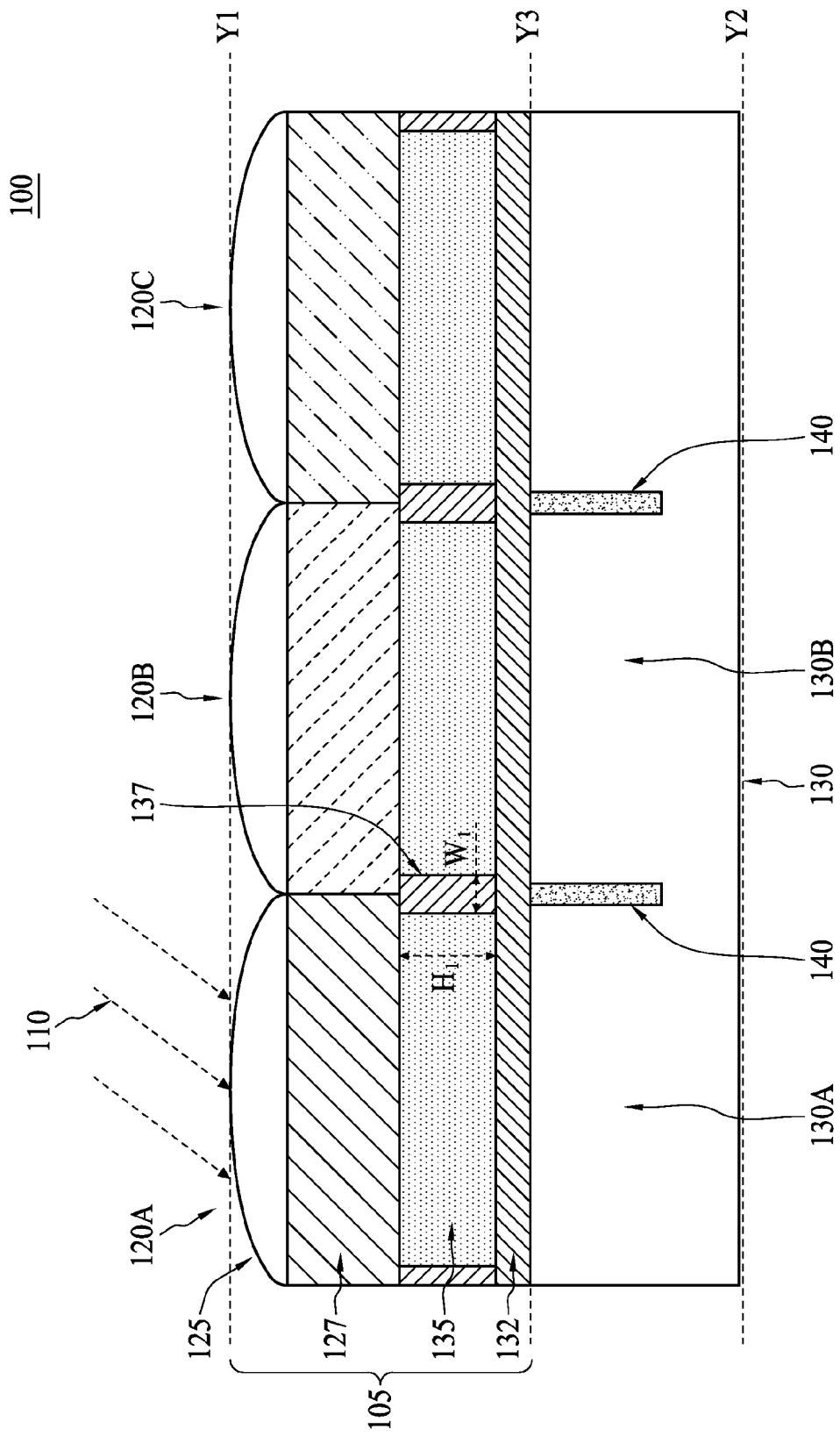
FIG. 1 is a cross sectional view of an image sensing device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In the drawings, like reference numbers are used to designate like or similar elements throughout the various views, and illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, substrate can refer either to the work piece upon which deposition is desired, or the surface exposed to one or more deposition gases. For example, in certain embodiments, the substrate is a single crystal silicon wafer, a semiconductor-on-insulator ("SOI") substrate, or an epitaxial silicon surface, a silicon germanium surface, or an III-V material deposited upon a wafer. Work pieces are not limited to wafers, but also include glass, plastic, or other substrates employed in semiconductor processing. In some embodiments, the substrate has been patterned to have two or more different types of surfaces, such as both semiconductor and insulator surfaces. Examples of insulator materials include silicon dioxide, including low dielectric constant forms, such as carbon-doped and fluorine-doped oxides of silicon, silicon nitride, metal oxide and metal silicate. In certain embodiments, silicon-containing layers are selectively formed over single crystal semiconductor materials while allowing for minimal or zero growth of material over adjacent insulators. According to some embodiments, any material growth over adjacent insulators may be amorphous or polycrystalline non-epitaxial growth.

In certain embodiments, the word "substrate" in the present disclosure represents a patterned substrate that has a first surface having a first surface morphology and a second surface having a second surface morphology. Even if surfaces are made from the same elements, the surfaces are considered different if the morphologies or crystallinity of the surfaces are different. Amorphous and crystalline are examples of different morphologies. Polycrystalline morphology is a crystalline structure that consists of a disorderly arrangement of orderly crystals and thus has an intermediate degree of order. The atoms in a polycrystalline material are ordered within each of the crystals, but the crystals themselves lack long range order with respect to one another. Single crystal morphology is a crystalline structure that has a high degree of long range order. Epitaxial films are characterized by an in-plane crystal structure and orientation that is identical to the substrate upon which they are grown, typically single crystal. The atoms in these materials are arranged in a lattice-like structure that persists over relatively long distances on an atomic scale. Amorphous morphology is a non-crystalline structure having a low degree of order because the atoms lack a definite periodic arrangement. Other morphologies include microcrystalline and mixtures of amorphous and crystalline material. "Non-epitaxial" thus encompasses amorphous, polycrystalline, microcrystalline and mixtures of the same. As used herein, "single-crystal" or "epitaxial" are used to describe a predominantly large crystal structure having a tolerable number of faults therein, as is commonly employed for transistor fabrication. The crystallinity of a layer generally falls along a continuum from amorphous to polycrystalline to single-crystal; a crystal structure is often considered single-crystal or epitaxial despite a low density of faults. Specific examples of patterned substrates having two or more different types of surfaces, whether due to different morphologies and/or different materials, include without limitation: single crystal/polycrystalline, single crystal/amorphous, single crystal/dielectric, conductor/dielectric, and semiconductor/dielectric.

An image sensing device is a device used to capture photons, and generate electrical signals from the received photons. In some embodiments, the image sensing device includes a pixel array having a number of sensor pixels. Each sensor pixel is designed to receive an incident light with a predetermined wavelength spectrum. In some embodiments, a lens structure is design to be accompanied with the image sensing device. Lights are configured to be projected through and focused by the lens structure before being received by the image sensing device. In certain embodiments, the focus length of the lens structure is fixed. Due to the nature of field curvature behavior of optical lenses, an aberration may occur at the peripheral of the image sensing device. In some embodiments, a curved image sensing device is applied to overcome the aberration issue.

FIG. 1 is a cross sectional view of an image sensing device in accordance with some embodiments of the present disclosure.

In some embodiments in accordance with the present disclosure, an image sensing device 100 of an image sensing device (not depicted) is provided. The image sensing device 100 is configured to capture photons. In some embodiments, the image sensing device 100 contains a complementary metal oxide semiconductor (CMOS) structure or a CMOS image sensing device (CIS) structure. Captured photons are converted by the CMOS or CIS structure to generate an electrical signal. Dotted arrow lines 110 are used to illustrate incident lights received by the image sensing device 100.

In some embodiments in accordance with the present disclosure, the image sensing device 100 has sensor pixels and each is designated to receive lights with a predetermined wavelength spectrum. For some embodiments with reference to FIG. 1, the image sensing device 100 has a sensor pixel 120A, a sensor pixel 120B and a sensor pixel 120C. The sensor pixel 120A is designated to receive incident lights and operate with a first wavelength spectrum. The sensor pixel 120B is designated to receive incident lights and operate with a second wavelength spectrum. The sensor pixel 120C is designated to receive incident lights and operate with a third wavelength spectrum. In some embodiments, the first wavelength spectrum is red, the second first wavelength spectrum is green, and the third wavelength spectrum is blue. Other wavelength spectrums are within the contemplated scope of the present disclosure. In some embodiments with reference to FIG. 1, no gap or spacing exists between adjacent sensor pixels 120A and 120B, and 120B and 120C, in order to have a maximum pixel density to achieve an optimized resolution.

In some embodiments in accordance with the present disclosure, each sensor pixel 120A, 120B or 120C has a similar structure. The following description is based on sensor pixel 120A, but is applicable to other pixels, including pixels 120B and 120C. As illustratively shown in FIG. 1, the sensor pixel 120A has an optical region 105, which is between line Y1 to line Y3 and a sensing region 130A, which is between line Y2 to line Y3. The optical region 105 is exposed under a light source. The sensing region 130A is disposed under the optical region 105. The sensing region 130A receives filtered incident lights and converts the photons of filtered incident lights into an electrical signal. For some embodiments, the sensing region 130A converts red photons into electrical signals.

In some embodiments in accordance with the present disclosure, a lens 125 is in the optical region 105. The top point of the lens 125 is substantially at a same level of line $Y_1$. The lens 125 is designed as a window for incident lights traveling into the sensor pixel 120A. In some embodiments, the lens 125 is a convex lens and the incident lights are focused by the lens 125.

In some embodiments in accordance with the present disclosure, a color filter 127 is disposed under the lens 125. The color filter 127 is used to filter incident lights to generate filtered lights with a desired wavelength spectrum. In some embodiments, the sensor pixel 120A is designated to detect red lights. The incident lights 110 are visible lights, which have a wide range of wavelength spectrum. The color filter 127 is designed to allow lights having a red wavelength spectrum to enter into the sensing region 130A of the sensor pixel 120A. In other words, the color filter 127 is a red light filter. Similarly, if the sensor pixel 120A is designated to detect green light, the color filter 127 is a green light filter, and if the sensor pixel 120A is designated to detect blue light, the color filter 127 is a blue light filter, etc.

In some embodiments in accordance with the present disclosure, in the optical region 105, a dielectric layer 135 is disposed under the color filter 127. In some embodiments, the dielectric layer 135 is made with silicon oxide, silicon nitride, or other suitable materials. The dielectric layer 135 separates the color filter 127 from the sensing region 130A. Filtered lights travel into the dielectric layer 135 before entering into the sensing region 130A. In order to avoid filtered lights entering into the adjacent sensor pixel 120B, a light guiding grid 137 is disposed along a sidewall of the dielectric layer 135 of the sensor pixels 120A and 120B. The light guiding grid 137 separates the dielectric layer 135 of the sensor pixel 120A from the dielectric layer 135 of the adjacent sensor pixel 120B. The light guiding grid 137 is made with light reflective material such as a metal or dielectric or other suitable materials. In some embodiments, the light guiding grid 137 includes AlCu, W, SiO2 or SiN. The light guiding grid 137 reflects filtered lights when the filtered lights hit the light guiding grid 137.

In some embodiments in accordance with the present disclosure, the sensor pixel 120A has an anti reflection coating (ARC) 132 under the dielectric layer 135. The ARC 132 has a refractive index, which is smaller than a refractive index of the sensing region 130A. Thus the filtered incident lights are not reflected by the ARC 132.

A semiconductor substrate 130 is a region defined between line $Y_2$ and line $Y_3$. The sensing region 130A of the sensor pixel 120A includes a portion of the substrate 130. In certain embodiments, such a portion is called an image sensing substrate. The image sensing substrate includes some image sensing devices such as a CMOS transistor, photodiodes, a transfer transistor, and other image sensing circuits. When the filtered lights enter into the sensing region 130A, the CMOS transistor converts captured photons into electrical signals.

In some embodiments illustrated in FIG. 1, dividers 140 are disposed in the substrate 130. One of the dividers 140 separates at least a portion of the sensing region 130A from the sensing region 130B of the adjacent sensor pixel 120B. The divider 140 prevents the filtered incident lights in the sensor pixel 120A from entering into the sensing region 130B of adjacent sensor pixel 120B; and vice versa. In some other embodiments, the sensor pixel 120A is designated to detect red lights, and the adjacent sensor pixel 120B is designated to detect green lights. With reference to the sensor pixel 120A, a certain amount of red light photons generates electrical signals that indicate the receiving lights are red lights. Further, a certain amount of green photons from the adjacent sensor pixel 120B is acceptably received by the sensor pixel 120A.

Figure 2A:
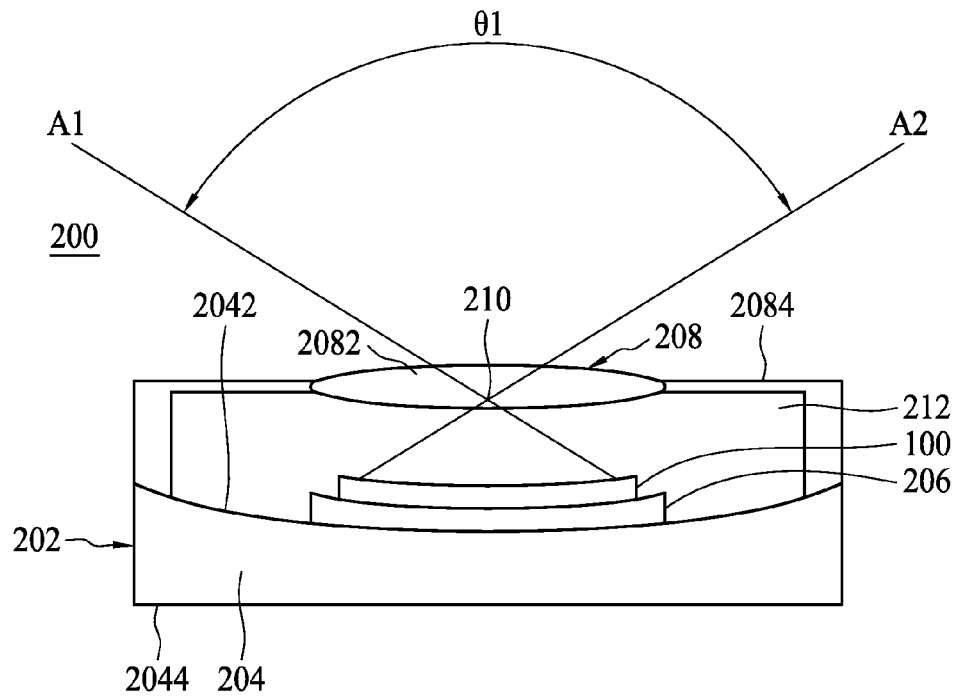
FIGS. 2A and 2B are cross sectional views of an image sensor in accordance with some embodiments of the present disclosure.
Figure 2B:
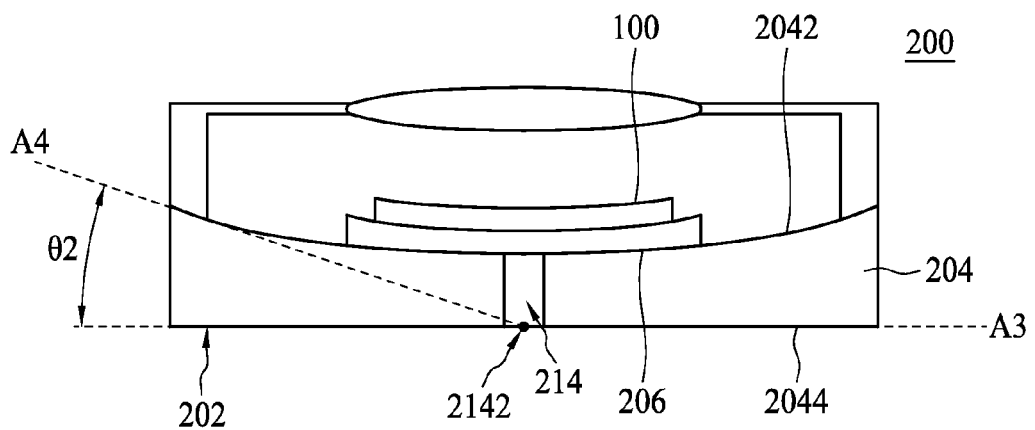

FIGS. 2A and 2B are cross sectional views of an image sensor in accordance with some embodiments of the present disclosure.

Referring to FIG. 2A, in some embodiments in accordance with the present disclosure, an image sensor 200 having a substrate 202 is provided. The substrate includes a body 204 having a first surface 2042 and an opposite second surface 2044. The first surface 2042 is configured to be curved. Accordingly, any component or device disposed there-upon may be configured to conform to the curved shape of the body 204. In certain embodiments, the substrate 202 is a silicon substrate capable of being bent and/or curved. Alternatively, the substrate 202 contains ceramic. In some embodiments, the substrate 202 has a thickness between about 0.5 mm and about 2 mm.

In some embodiments in accordance with the present disclosure, an intermediate layer 206 is disposed over the substrate 202. The intermediate layer 206 is configured to receive and accommodate an image sensing device 100 as in FIG. 1. In certain embodiments, the image sensing device 100 includes a semiconductor chip having a CMOS image sensing array. In addition, the intermediate layer 206 is configured to secure the image sensing device 100 to the body 204. In certain embodiments, when a shape of the body 204 is changed, the shape of the intermediate layer 206 is configured to change correspondingly so as to change the shape of the image sensing device 100. In other words, the intermediate layer 206 serves to adjust the shape of the image sensing device 100 to conform to the shape of the body 204 of the substrate 202. In certain embodiments, the intermediate layer 206 is made of an adhesive and/or deformable material and has a thickness between about 0.05 mm and about 0.5 mm.

In some embodiments in accordance with the present disclosure, a lens structure 208 having a lens 2082 and a lens holder 2084 is provided over the substrate 202. A vacuum is generated at the compartment 212 between the lens structure 208 and the substrate 202. The lens holder 2084 is configured to uphold and align the lens 2082 with the image sensing device 100. The lens holder 2084 is made of materials such as polycarbonate (PC), acrylonitrile butadiene styrene (ABS), polyphthalamide (PPA), polyphenylene oxide (PPO) or the like. In certain embodiments, the lens 2082 is a convex lens configured to focus lights. Accordingly, light travelling from a light source is focused by the lens 2082 to be received by the image sensing device 100. Based on the imaging principle for convex lens, a field of view (FOV) of θ1 degrees is generated for the image sensor 200. The FOV is an angle through which a sensor is sensitive to incoming light beams. In some embodiments, θ1 is the angle between two lines (labeled as A1 and A2 in FIG. 2A) projected from the edge of the image sensing device 100 through a focus point 210 of the lens 2082. In certain embodiments, the FOV of the image sensor 200 in accordance with the present disclosure is larger than about 70 degrees. An image sensor 200 having a larger FOV is capable of receiving wider or closer object images. In addition, the issue of aberration at peripherals of the image sensor 200 may be improved.

Referring to FIG. 2B, in some embodiments in accordance with the present disclosure, an image sensor 200 having a curved substrate 202 is provided. The substrate 202 includes a curved first surface 2042 and a substantially flat second surface 2044 opposite to the first surface 2042. In addition, a through via 214 is provided at around the central portion of the substrate 202. The through via 214 is configured to extend from the first surface 2042 to the second surface 2044 such that the substrate 202 is penetrated by the through via 214. The through via 214 is covered by the intermediate layer 206 at the first surface 2042. Due to the deformable material of the intermediate layer 206, when a suction force is provided at the through via 214 at the second surface 2044, the middle portion of the intermediate layer 206 is pulled in a direction from the first surface 2042 towards the second surface 2044. Consequently, the intermediate layer 206 is vacuumed downwards so as to conform to the curved shape of the first surface 2042. In certain embodiments, a vacuum is maintained at the through via 214 after the intermediate layer 206 is curved to a predetermined angle or curvature. Therefore, the image sensing device 100 is also deformed in accordance with the change-of-shape of the intermediate layer 206 and/or the body 204 of the substrate 202. As a result, the FOV of the image sensor 200 is changed due to the adjusted receiving surface of the image sensing device 100 resulted from the deformation of the intermediate layer 206. In certain embodiments, the FOV of the image sensor 200 in accordance with the present disclosure is larger than about 70 degrees.

In some embodiments in accordance with the present disclosure, the first surface 2042 of the substrate 202 is curved to a predetermined shape such that the image sensing device 100 correspondingly curved may reach a desirable angle. A curved angle of the body 204 of the substrate 202 is θ2, which is the angle between lines A3 and A4. Line A3 represents the plane that the substrate 200 is disposed on. Line A4 represents the connection between an external perimeter of the first surface 2042 and the central point 2142 of the second surface 2044. In certain embodiments, θ2 is configured between about 30 degrees and about 120 degrees such that the FOV of the image sensor 200 may be configured to be larger than about 70 degrees. Consequently, the intermediate layer 206 and/or the substrate 100 is curved between about 30 degrees and about 120 degrees such that the intermediate layer 206 and/or the substrate 100 conforms with the shape of the surface 2042.

In some embodiments in accordance with the present disclosure, the intermediate layer 206 is first deformed when attached to the curved first surface 2042. After the image sensing device 100 is attached to the intermediate layer 206, the intermediate layer 206 is deformed for the second time so as to ensure that the image sensing device 100 is also curved. In certain embodiments, the higher the curvature of the image sensing device 100 is, the larger the FOV of the image sensor 200 is. In other words, the FOV θ1 is proportional to the curvature θ2.

Figure 3:
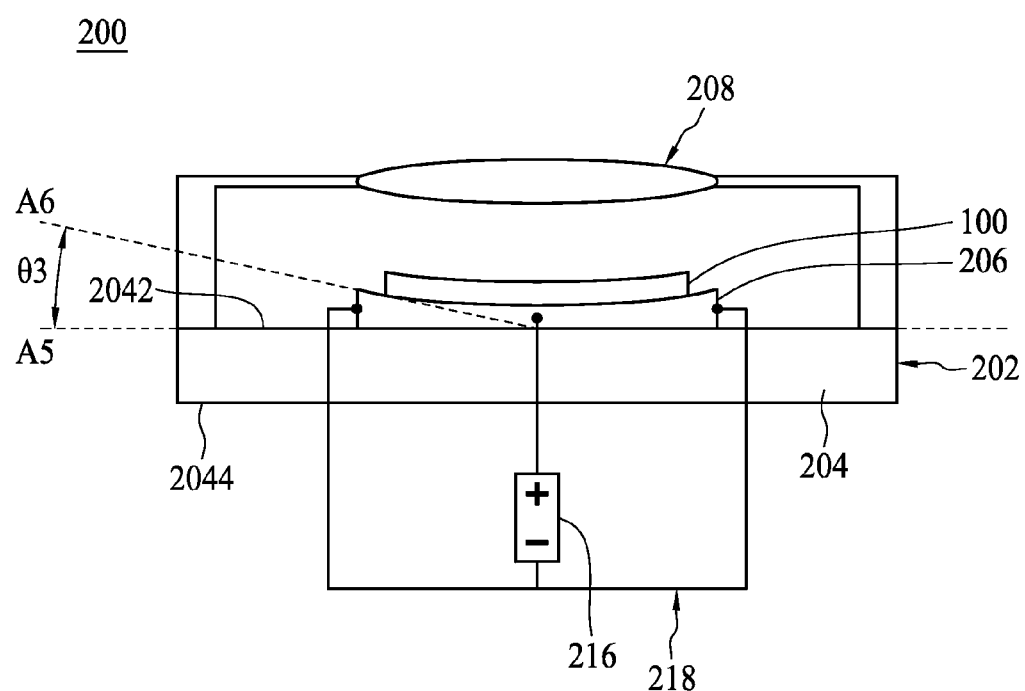
FIG. 3 is a cross sectional view of an image sensor in accordance with some embodiments of the present disclosure.

FIG. 3 is a cross sectional view of an image sensor in accordance with some embodiments of the present disclosure.

In some embodiments in accordance with the present disclosure, an image sensor 200 having a substrate 202 is provided. An intermediate layer 206 is provided over the substantially flat first surface 2042 of the substrate 202. An image sensing device 100 is provided over and secured to the intermediate layer 206. In certain embodiments, the intermediate layer 206 is configured to be curved whereas the substrate 202 is remained at its original shape. Consequently, the image sensing device 100 disposed on the intermediate layer 206 is also curved due to the deformation of the intermediate layer 206.

In some embodiments in accordance with the present disclosure, the intermediate layer 206 includes a piezoelectric material such as synthetic crystal, synthetic ceramic, lead-free piezoceramic, polymer or the like. Accordingly, when electric current is introduced to the intermediate layer 206, the shape of the intermediate layer 206 is changed correspondingly. Intermediate layer 206 of other electrically deformable material is within the contemplated scope of the present disclosure. By adjusting the position of the entering point of the electric current, the deformation of the intermediate layer 206 is controlled such that a predetermined curvature of the intermediate layer 206 is achieved. In certain embodiments, the intermediate layer 206 is electrically connected to two poles of a power source 216. The power source 216 is configured to provide electric current to the intermediate layer 206 and the intermediate layer 206 is configured to be curved in response to such electric current. In some embodiments, the middle portion of the intermediate layer 206 is connected to the north pole of the power source 206, and the external perimeter portions of the intermediate layer 206 are connected to the south pole of the power source 206. When electric current is provided, the deformation at the external perimeter portions of the intermediate layer 206 is larger than that at the middle portion of the intermediate layer 206. Accordingly, the intermediate layer 206, as well as the image sensing device 100 provided thereon, is curved and a smiling-shape is achieved.

In some embodiments in accordance with the present disclosure, a curved angle of the intermediate layer 206 is θ3, which is the angle between lines A5 and A6. Line A5 represents the plane that the intermediate layer 206 is disposed on. Line A6 represents the connection between an external perimeter and the central point of the intermediate layer 206. In certain embodiments, θ3 is configured between about 30 degrees and about 120 degrees such that the FOV of the image sensor 200 may be configured between about 70 degrees and about 170 degrees. In other words, by changing the voltage of the electric current provided by the power source 216, the FOV of the image sensor 200 is adjusted. Consequently, when the image sensor 200 is required to receive target image that requires a larger FOV, the FOV of the image sensor 200 may be adjusted through deforming the intermediate layer 206 as well as the image sensing device 100 thereon. As a result, a less complicated lens structure 208, e.g., less number of lenses, may be applied to the image sensor 200 while the FOV of the image sensor 200 is maintained to be over 70 degrees. In addition, the FOV of the image sensor 200 may be adjusted in response to the requirement of the device that the image sensor 200 is applied on.

In some embodiments in accordance with the present disclosure, the intermediate layer 206 is electrically connected to the power source 216 through conductive traces 218. The substrate 202 is configured to accommodate the conductive traces 218 such that electric current is transmitted from the power source 216 to the intermediate layer 206 without interruption. In some embodiments the substrate 202 includes a circuitry such that conductive traces can be deployed within the substrate 202. In addition, the substrate 202 includes material capable of remaining its shape when the intermediate layer 206 is deformed. For example, the substrate 202 includes polymer polysilicon or the like. In certain embodiments, the substrate 202 is a printed circuit board (PCB) or any similar structure capable of accommodating trace or circuit design therein. In some embodiments, the power source 216 is embedded in the substrate 202. In certain embodiments, the substrate 202 has a thickness between about 0.05 mm and about 0.5 mm.

In some embodiments in accordance with the present disclosure, the intermediate layer 206 and the image sensing device 100 are substantially flat when first disposed over the substrate 202. Thereafter, when electric current is provided from the power source 216 to the intermediate layer 206, the intermediate layer 206 is deformed and curved. Correspondingly, the image sensing device 100 secured thereon is configured to be curved and conform to the changed shape of the intermediate layer 206. In certain embodiments, the higher the curvature of the image sensing device 100 is, the larger the FOV of the image sensor 200 is. In other words, the FOV θ1 is proportional to the curvature θ3.

In some embodiments in accordance with the present disclosure, the intermediate layer 206 and the image sensing device 100 is connected by a flexible and adhesive material such that the image sensing device 100 stays in conformation with the shape of the intermediate layer 206.

Figure 4:
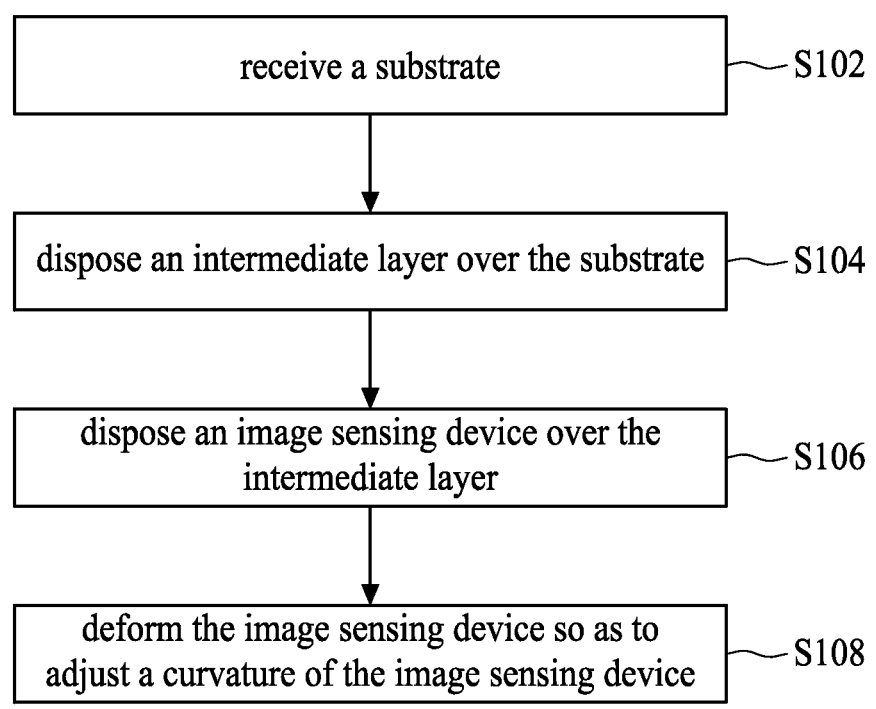
FIG. 4 is a flow diagram of a method for adjusting image sensor in accordance with some embodiments of the present disclosure.

FIG. 4 is a flow diagram of a method for adjusting image sensor in accordance with some embodiments of the present disclosure.

In some embodiments in accordance with the present disclosure, in operation S102, a substrate is received. In certain embodiments, the substrate is an image sensing substrate. In operation S104, an intermediate layer is disposed over the substrate. The intermediate layer is secured to the substrate by adhesive. Alternatively, the intermediate layer contains adhesive material such that its position in maintained after being attached to the substrate. In certain embodiments, the intermediate layer is configured to conform to the shape of the substrate.

In some embodiments in accordance with the present disclosure, in operation S106, an image sensing device is disposed over the intermediate layer. The image sensing device is secured to the intermediate layer through an adhesive or by means of the adhesive material of the intermediate layer. In operation S108, the image sensing device is deformed such that its curvature is adjusted. In some embodiments, the image sensing device is curved and becomes a smiling shape. In certain embodiments, the image sensing device is configured to conform to the shape of the intermediate layer. In some embodiments, the image sensing device is configured to conform to the shape of the substrate.

In some embodiments in accordance with the present disclosure, a lens structure is provided over the substrate. The lens structure is configured to focus light to be received by the image sensing device. Accordingly, an image sensor is formed. The image sensor has a first FOV, which may be smaller than about 70 degrees. Through deforming the image sensing device so as to change the curvature of the images sensing device, the FOV of the image sensor is adjusted. In some embodiments, the FOV of the image sensor is increased to between about 70 degrees and 170 degrees. In certain embodiments, the FOV of the image sensor is proportional to the curvature of the image sensing device.

FIGS. 5A to 5E are cross-sectional views of an image sensor in various stages corresponding to the method of FIG. 4.

Figure 5A:
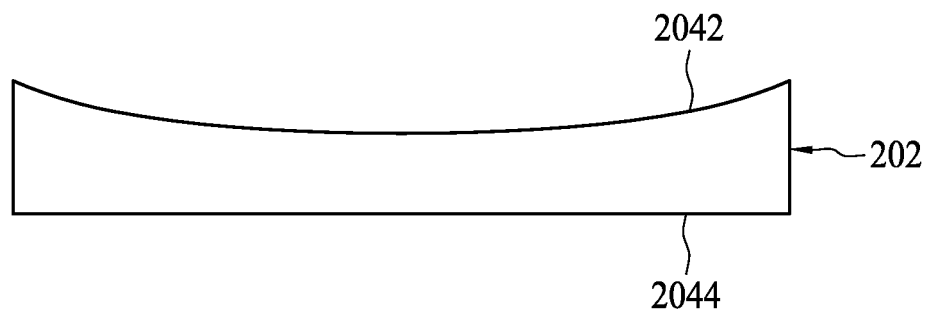
FIGS. 5A to 5E are cross-sectional views of an image sensor in various stages corresponding to the method of FIG. 4.

Referring to FIG. 5A, in some embodiments in accordance with the present disclosure, a substrate 202 is provided. The substrate 202 is substantially in a smiling shape. In other words, the first surface 2042 of the substrate 202 is curved, and the second surface 2044 of the substrate 202 is substantially flat. The degree of curvature of the substrate 202, i.e., the first surface 2042, depends on the requirement of the image sensor of the final product. For example, if the final product requires a larger FOV, the curvature of the substrate 202 needs to be larger. In certain embodiments, the substrate 202 is a silicon substrate capable of being bent and/or curved. Alternatively, the substrate 202 contains ceramic. In some embodiments, the substrate 202 has a thickness between about 0.5 mm and about 2 mm.

Figure 5B:
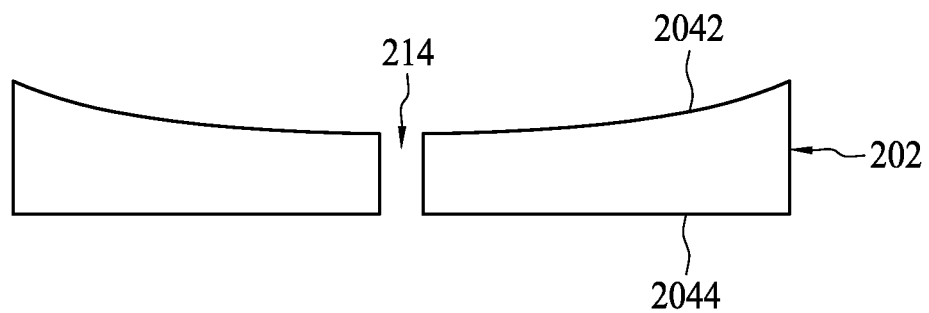

Referring to FIG. 5B, in some embodiments in accordance with the present disclosure, a through via 214 is generated between the first surface 2042 and the second surface 2044. The through via 214 substantially aligns with a central line of the substrate 202. The through via 214 penetrates through the image sensing structure 202 such that air may flow through the image sensing structure 202 via the through via 214. Ways to construct the through via 214 includes drilling, etching, lithography, through silicon via (TSV), cutting and so on. Other ways to construct a through via at semiconductor substrate are within the contemplated scope of the present disclosure.

Figure 5C:
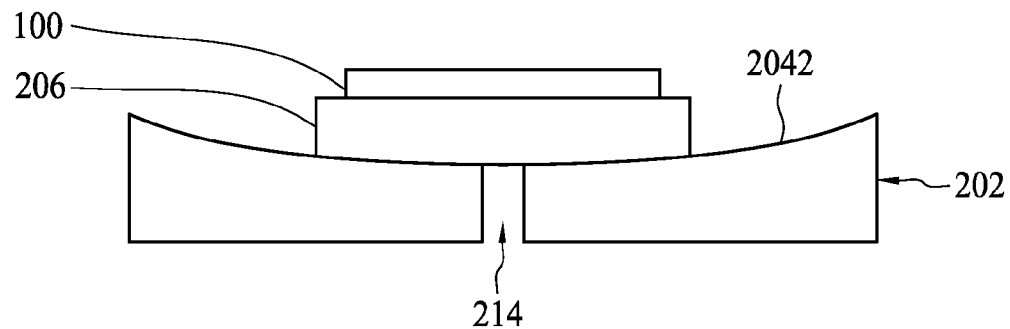

Referring to FIG. 5C, in some embodiments in accordance with the present disclosure, an intermediate layer 206 is provide over the substrate 202 and covers the through via 214 at the first surface 2042. Accordingly, the through via 214 is sealed at the first surface 2042. Moreover, an image sensing device 100 is provided over the intermediate layer 206. In certain embodiments, the intermediate layer includes adhesive material so as to secure itself to the substrate 202 and to secure the image sensing device 100 thereon. In some embodiments, the intermediate layer 206 includes deformable material. Consequently, when disposed on the first surface 2042, the shape of the intermediate layer 206 is changed due to the curved first surface 2042. In other words, the intermediate layer 206 conforms to the shape of the substrate 202 when disposed on the substrate 202. As a result, the shape of the image sensing device 100 disposed on the intermediate layer 206 is also changed in accordance to the change-of shape of the intermediate layer 206. In other words, the shape of the image sensing device 100 is conformed with the shape of the substrate 202.

Figure 5D:
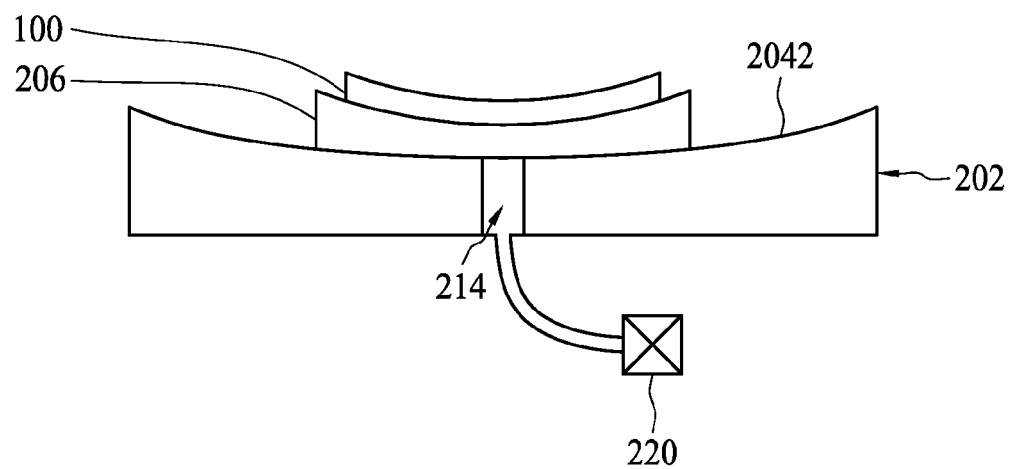

Referring to FIG. 5D, in some embodiments in accordance with the present disclosure, air is vacuumed out of the through via 214 by a pump 220. When air is being vacuumed out of the through via 214, a suction force is generated against the intermediate layer 206 at the first surface 2042. Accordingly, the middle portion of the intermediate layer 206 layer is pulled in a direction from the first surface 2042 to the second surface 2044. Therefore, the middle portion of the intermediate layer 206 is lowered while the perimeter portions of the intermediate layer 206 substantially remain at a same position or a same height. Consequently, the intermediate layer 206 is configured to align and conform to the curved first surface 2042 more, and the curvature of the intermediate layer 206 is increased. As a result, the curvature of the image sensing device 100 is also increased as the image sensing device 100 is secured to and configured to conform to the shape of the intermediate layer 206. In other words, the more the intermediate layer 206 is deformed due to vacuuming of the through via 214, the larger the curvature of the image sensing device 100 becomes. An image sensing device having a larger curvature results in an image sensor final product of larger FOV.

Figure 5E:
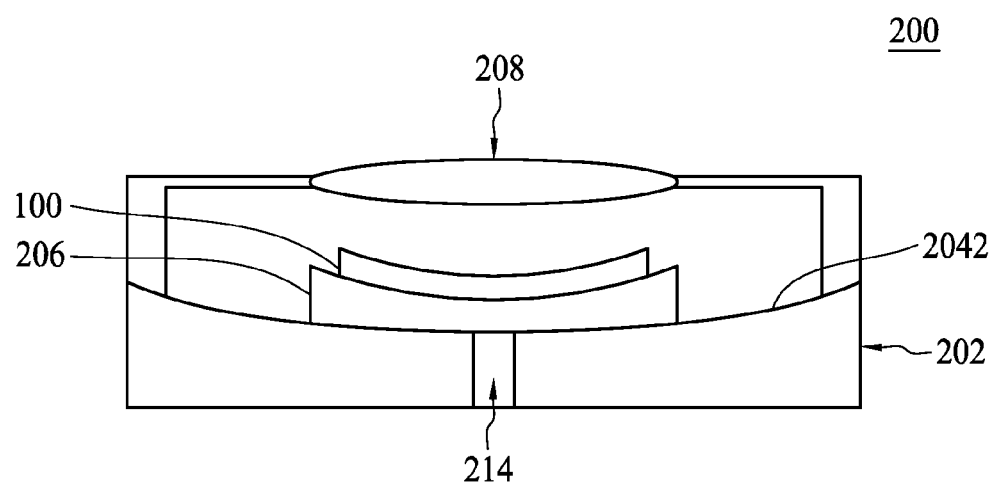

Referring to FIG. 5E, in some embodiments in accordance with the present disclosure, a lens structure 208 is provided over the substrate 202, the intermediate layer 206 and the image sensing device 100. Accordingly, an image sensor 200 is created. Lights are focused by the lens structure 208 and received by the image sensing device 100. Due to the fixed structural relationship between the lens structure 208 and the substrate 202, the FOV of the image sensor 200 was limited and fixed. However, by adjusting the curvature of the first surface 2042, which leads to the curvature adjustments of the intermediate layer 206 as well as the image sensing device 100, the FOV of the image sensing device 100 is also adjusted. In certain embodiments, the FOV of the image sensing device 100 is increase to more than about 70 degrees. In some embodiments, the compartment between the lens structure 208 and the substrate 202 are remained at a vacuumed state so as to increase the durability of the image sensor 200.

Figure 6A:
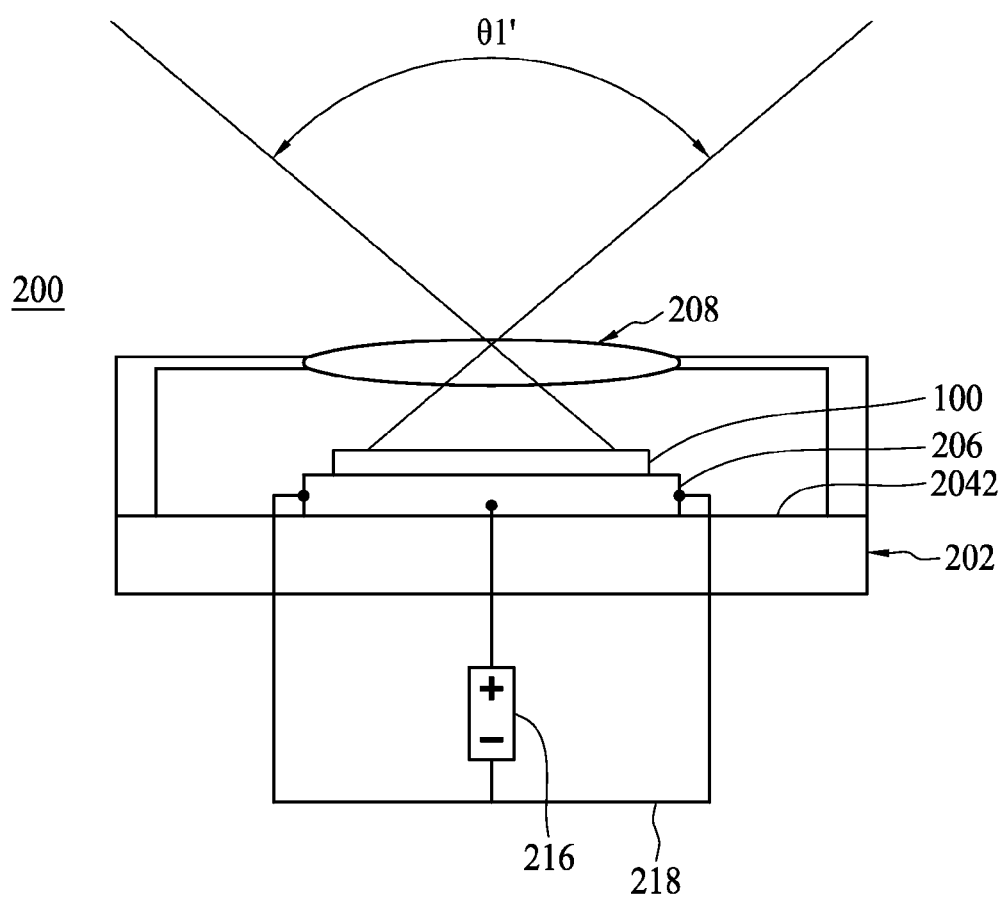
FIGS. 6A to 6C are cross-sectional views of an image sensor in various stages corresponding to the method of FIG. 4.
Figure 6B:
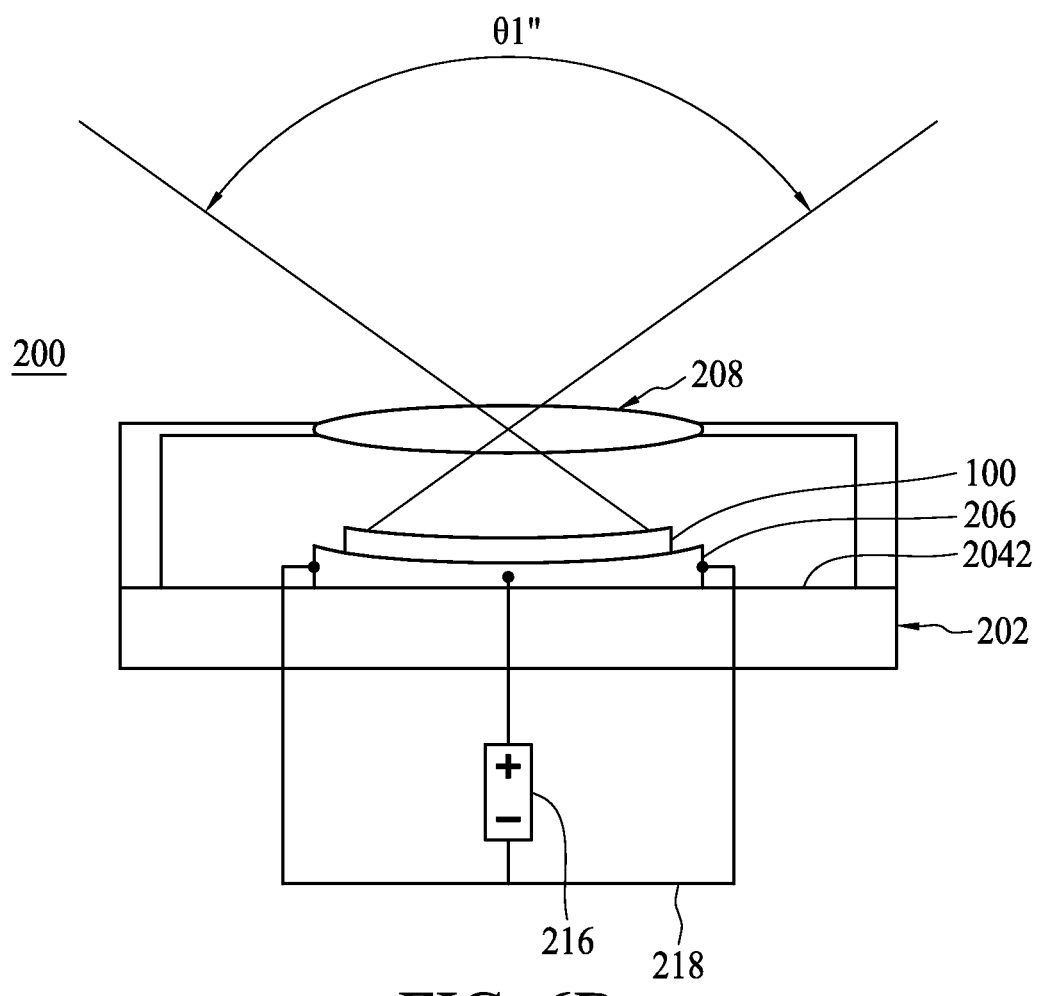
Figure 6C:
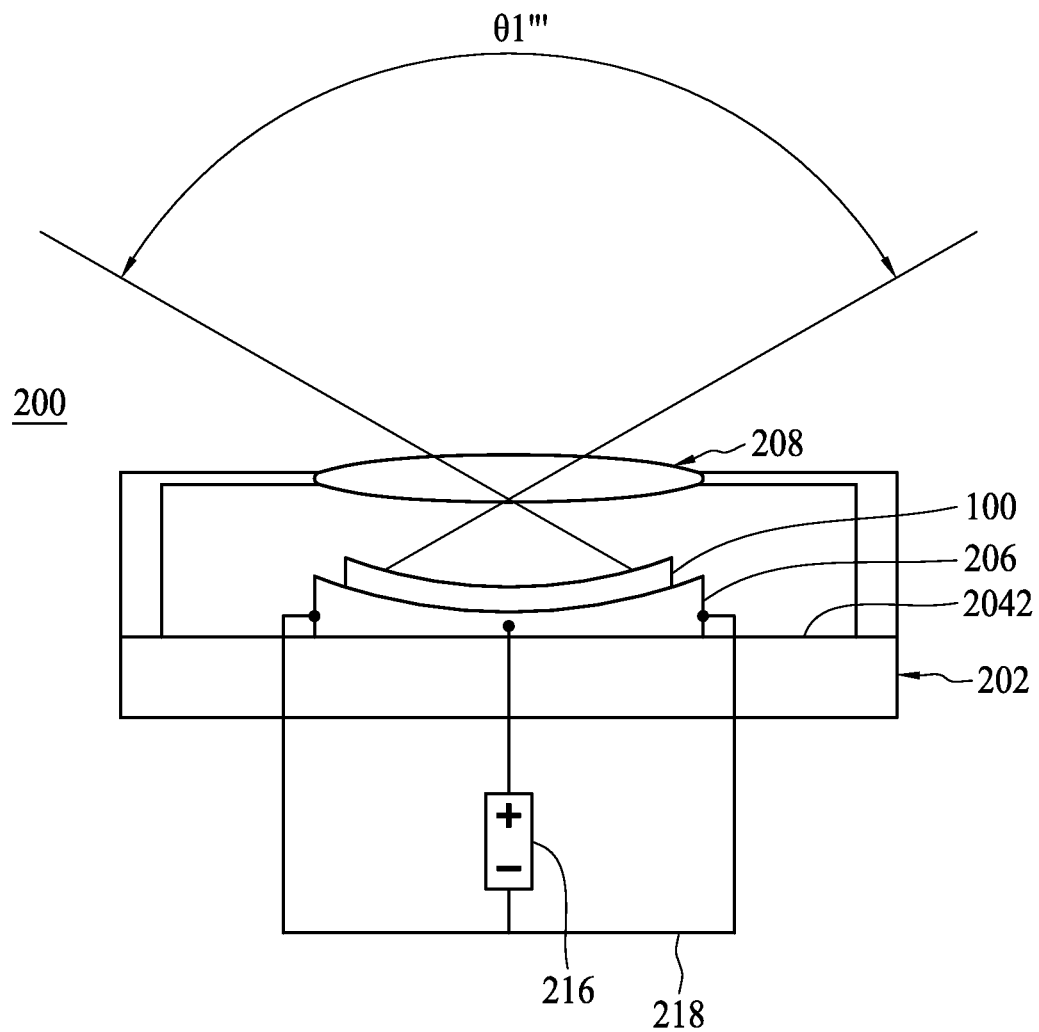

FIGS. 6A to 6C are cross-sectional views of an image sensor in various stages corresponding to the method of FIG. 4.

Referring to FIG. 6A, in some embodiments in accordance with the present disclosure, an image sensor 200 having a substrate 202 is provided. An intermediate layer 206 is provided over a substantially flat first surface 2042 of the substrate 202. The intermediate layer 206 includes a piezoelectric material such as synthetic crystal, synthetic ceramic, lead-free piezoceramic, polymer or the like. Accordingly, when electric current is introduced to the intermediate layer 206, the shape of the intermediate layer 206 is changed correspondingly. By adjusting the voltage of the electric current, the deformation of the intermediate layer 206 is controlled such that a predetermined curvature of the intermediate layer 206 is achieved. In some embodiments in accordance with the present disclosure, the intermediate layer 206 is electrically connected to two poles of a power source 216, which is configured to provide electric current to the intermediate layer 206 and the intermediate layer 206 is configured to be curved in response to such electric current. Accordingly, the image sensing device 100 is curved due to the deformation of the intermediate layer 206. In some embodiments, through the conductive traces 218, the middle portion of the intermediate layer 206 is connected to the north pole of the power source 206, and the external perimeter portions of the intermediate layer 206 are connected to the south pole of the power source 206. In certain embodiments, the image sensor 200 has a FOV of θ1' degrees when no electricity is provided to the intermediate layer 206.

Referring to FIG. 6B, in some embodiments in accordance with the present disclosure, when electric current is provided, the deformation at the external perimeter portions of the intermediate layer 206 is larger than that at the middle portion of the intermediate layer 206. Accordingly, the intermediate layer 206, as well as the image sensing device 100 provided thereon, is curved and a smiling-shape is achieved. In other words, the curvature of the intermediate layer 206 and the image sensing device 100 is increased. As a result, the FOV of the image sensor 200 is adjusted. In certain embodiments when an electric current having a first voltage is provided to the intermediate layer 206, the FOV of the image sensor 200 is adjusted from θ1' degrees to θ1" degrees, whereas θ1" is larger than θ1'. Accordingly, the FOV of the image sensor 200 is proportional to the voltage of the electric current received by the intermediate layer 206.

Referring to FIG. 6C, in some embodiments in accordance with the present disclosure, when an electric current having a second voltage, which is larger than the first voltage, is provided to the intermediate layer 206, the curvature of the intermediate layer 206 is further increased. Consequently, the curvature of the image sensing device 100 is also increased. As a result, the FOV of the image sensor 200 is adjust from θ1" degrees to θ1'" degrees, whereas θ1'" is larger than θ1". In certain embodiments, the FOV of the image sensor 200 may be adjusted between about 70 degrees and about 170 degrees. Accordingly, the image sensor in accordance with the present disclosure provides a mechanism for adjusting FOV while only lens structure of less complexity or lower price is required. Moreover, an image sensor having a larger FOV may help to overcome the aberration issue.

In some embodiments in accordance with the present disclosure, an image sensor having a substrate is provided. The substrate includes a body having a first surface and a second surface opposite to the first surface. A through via extends from the first surface to the second surface so as to penetrate the substrate. An intermediate layer is provided over the body and configured to cover the through via at the first surface. An image sensing device is provided over the intermediate layer. In addition, a lens structure is provided over the substrate, the intermediate layer and the image sensing device. In certain embodiments, the image sensing device is curved. In some embodiments, the image sensing device comprises a semiconductor chip comprising a CMOS image sensing array. In certain embodiments, the image sensor has a field of view (FOV) of more than about 70 degrees.

In some embodiments in accordance with the present disclosure, the intermediate layer comprises deformable material. In certain embodiments, the intermediate layer comprises adhesive material.

In some embodiments in accordance with the present disclosure, a vacuum is generated at the through via between the intermediate layer and the second surface of the body of the substrate. In certain embodiments, a vacuum is generated at a compartment surrounded by the lens structure and the substrate.

In some embodiments in accordance with the present disclosure, the lens structure is not in contact with the image sensing device and is upheld by a holder.

In some embodiments in accordance with the present disclosure, the body of the substrate is curved and the image sensing device is configured to conform to a shape of the body of the substrate. In certain embodiments, the image sensing device is configured to conform to a shape of the intermediate layer.

In some embodiments in accordance with the present disclosure, an image sensor having a substrate is provided. An intermediate layer is provided over the substrate. In addition, an image sensing device is provided over the intermediate layer. Moreover, a lens structure is provided over the substrate, the intermediate layer and the image sensing device. The intermediate layer is configured to electrically connect to two poles of a power source, which is configured to provide electric current to the intermediate layer. In certain embodiments, the intermediate layer is configured to be curved in response to the electric current provided by the power source. In some embodiments, a field of view (FOV) of the image sensor is configured to be adjusted between about 70 degrees and about 170 degrees.

In some embodiments in accordance with the present disclosure, the substrate includes circuitry. In certain embodiments, the intermediate layer is connected to the power source through conductive traces, and the conductive traces run through the substrate.

In some embodiments in accordance with the present disclosure, the shape of the intermediate layer is configured to be adjusted according to a voltage of the electrical current from the power source. Correspondingly, the image sensing device is configured to conform to the changed shape of the intermediate layer.

In some embodiments in accordance with the present disclosure, the intermediate layer comprises piezoelectric material.

In some embodiments in accordance with the present disclosure, a method for adjusting image sensor is provided. In one operation, a substrate is received. In one operation, an intermediate layer is disposed over the substrate. In one operation, an image sensing device is disposed over the intermediate layer. In one operation, the image sensing device is deformed so as to adjust a curvature of the image sensing device.

In some embodiments in accordance with the present disclosure, in one operation, a curvature of the substrate is adjusted. In one operation, the image sensing device is configured to conform to the shape of the substrate.

In some embodiments in accordance with the present disclosure, in one operation, a curvature of the intermediate layer is adjusted by vacuuming the intermediate device. In one operation, the image sensing device is configured to conform to the shape of the intermediate layer.

In some embodiments in accordance with the present disclosure, in one operation, a curvature of the intermediate layer is adjusted by providing an electric current to the intermediate layer. In one operation, the image sensing device is configured to conform to the shape of the intermediate layer.

In some embodiments in accordance with the present disclosure, in one operation, a voltage of an electric current provided to the intermediate layer is increased so as to increase the curvature of the intermediate layer. In one operation, the image sensing device is configured to conform to the shape of the intermediate layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
a substrate including a body with a first surface and an opposite second surface, wherein a through via is configured to extend from the first surface to the second surface;
an intermediate layer over the body and covering the through via;
an image sensing device adhered to the intermediate layer through an adhesive material of the intermediate layer, wherein a curvature of the intermediate layer is controlled by introducing electric current into the intermediate layer by connecting only a north pole of a power source to a middle portion of the intermediate layer and connecting only a south pole of the power source to a perimeter portion of the intermediate layer; and
a lens structure over the substrate, the intermediate layer and the image sensing device,
wherein the image sensing device is curved.

2. The image sensor according to claim 1, wherein the image sensing device comprises a semiconductor chip comprising a CMOS image sensing array.

3. The image sensor according to claim 1, wherein the intermediate layer comprises deformable material.

4. The image sensor according to claim 1, wherein the intermediate layer comprises the adhesive material.

5. The image sensor according to claim 1, wherein a vacuum is generated at the through via between the intermediate layer and the second surface of the body of the substrate.

6. The image sensor according to claim 1, wherein a vacuum is generated at a compartment surrounded by the lens structure and the substrate.

7. The image sensor according to claim 1, wherein the body of the substrate is curved and the image sensing device is configured to conform to a shape of the body of the substrate.

8. The image sensor according to claim 1, wherein the image sensing device is configured to conform to a shape of the intermediate layer.

9. The image sensor according to claim 1, wherein the image sensor has a field of view (FOV) of more than about 70 degrees.

10. An image sensor, comprising:
a substrate;
an intermediate layer over the substrate;
an image sensing device over the intermediate layer; and
a lens structure over the substrate, the intermediate layer and the image sensing device,
wherein the intermediate layer is configured to electrically connect to a power source so as electric current from the power source is introduced into the intermediate layer,
wherein the intermediate layer is configured to be curved in response to the electric current from the power source, and a north pole of the power source is connected only to a middle portion of the intermediate layer and a south pole of the power source is connected only to a perimeter portion of the intermediate layer.

11. The image sensor according to claim 10, wherein the substrate includes circuitry.

12. The image sensor according to claim 10, wherein the intermediate layer is connected to the power source through conductive traces, and the conductive traces run through the substrate.

13. The image sensor according to claim 10, wherein the image sensing device is configured to conform to a shape of the intermediate layer, which is configured to be adjusted according to a voltage of the electrical current from the power source.

14. The image sensor according to claim 10, wherein the intermediate layer comprises piezoelectric material.

15. The image sensor according to claim 10, wherein a field of view (FOV) of the image sensor is configured to be adjusted between about 70 degrees and about 170 degrees.

16. A method for adjusting image sensor, comprising:
receiving a substrate;
disposing an intermediate layer over the substrate;
adhering an image sensing device to the intermediate layer through an adhesive material of the intermediate layer;
connecting a power source between a middle portion and a perimeter portion of the intermediate layer to introduce electric current into the intermediate layer via the middle portion and the perimeter portion to control a curvature of the intermediate layer, wherein a north pole of the power source is connected only to the middle portion of the intermediate layer and a south pole of the power source is connected only to the perimeter portion of the intermediate layer; and
deforming the image sensing device so as to adjust a curvature of the image sensing device.

17. The method according to claim 16, further comprising:
adjusting a curvature of the substrate; and
conforming the image sensing device with a shape of the substrate.

18. The method according to claim 16, further comprising:
adjusting a curvature of the intermediate layer by vacuuming the intermediate device; and
conforming the image sensing device with a shape of the intermediate layer.

19. The method according to claim 16, further comprising:
adjusting a curvature of the intermediate layer by providing an electric current to the intermediate layer; and
conforming the image sensing device with a shape of the intermediate layer.

20. The method according to claim 16, further comprising:
increasing a voltage of an electric current provided to the intermediate layer so as to increase the curvature of the intermediate layer; and
conforming the image sensing device with a shape of the intermediate layer.

* * * * *